United States Patent
Wu et al.

(10) Patent No.: US 9,576,855 B2
(45) Date of Patent: Feb. 21, 2017

(54) DEVICE AND METHODS FOR HIGH-K AND METAL GATE STACKS

(71) Applicant: Taiwan Semiconductor Manufacturing Company, Ltd., Hsin-Chu (TW)

(72) Inventors: Wei Cheng Wu, Zhubei (TW); Bao-Ru Young, Zhubei (TW); Harry-Hak-Lay Chuang, Singapore (SG); Jin-Aun Ng, Hsinchu (TW); Po-Nien Chen, Miaoli (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/679,525

(22) Filed: Apr. 6, 2015

(65) Prior Publication Data
US 2015/0214115 A1 Jul. 30, 2015

Related U.S. Application Data

(62) Division of application No. 13/457,079, filed on Apr. 26, 2012, now Pat. No. 9,000,533.

(51) Int. Cl.
*H01L 21/8238* (2006.01)
*H01L 21/8234* (2006.01)
*H01L 27/06* (2006.01)
*H01L 29/49* (2006.01)
*H01L 29/51* (2006.01)

(52) U.S. Cl.
CPC ........... *H01L 21/823462* (2013.01); *H01L 21/823842* (2013.01); *H01L 21/823857* (2013.01); *H01L 27/0629* (2013.01); *H01L 29/4925* (2013.01); *H01L 29/513* (2013.01); *H01L 29/517* (2013.01); *H01L 29/518* (2013.01)

(58) Field of Classification Search
CPC ..................................... H01L 21/823
See application file for complete search history.

(56) References Cited

U.S. PATENT DOCUMENTS

| | | | |
|---|---|---|---|
| 7,868,361 B2* | 1/2011 | Cheng | H01L 21/823412 257/217 |
| 8,008,143 B2* | 8/2011 | Hsu | H01L 21/82345 438/183 |
| 8,524,588 B2 | 9/2013 | Lin et al. | |
| 8,698,252 B2 | 4/2014 | Chen | |

(Continued)

*Primary Examiner* — Chandra Chaudhari
(74) *Attorney, Agent, or Firm* — Haynes and Boone, LLP

(57) ABSTRACT

A method for fabricating a semiconductor device includes providing a semiconductor substrate having regions for an n-type field-effect transistor (nFET) core, an input/output nFET (nFET IO), a p-type field-effect transistor (pFET) core, an input/output pFET (pFET IO), and a high-resistor, forming an oxide layer on the IO regions of the substrate, forming an interfacial layer on the substrate and the oxide layer, depositing a high-k (HK) dielectric layer on the interfacial layer, depositing a first capping layer of a first material on the HK dielectric layer, depositing a second capping layer of a second material on the HK dielectric layer and on the first capping layer, depositing a work function (WF) metal layer on the second capping layer, depositing a polysilicon layer on the WF metal layer, and forming gate stacks on the regions of the substrate.

19 Claims, 16 Drawing Sheets

(56) References Cited

U.S. PATENT DOCUMENTS

2010/0148262 A1 6/2010 Stahrenberg et al.
2010/0178772 A1 7/2010 Lin et al.
2011/0073964 A1 3/2011 Chowdhury et al.
2011/0195557 A1 8/2011 Teo et al.
2013/0285151 A1 10/2013 Wu
2013/0299913 A1 11/2013 Lin

* cited by examiner

DEVICE AND METHODS FOR HIGH-K AND METAL GATE STACKS

PRIORITY INFORMATION

This application is a divisional of U.S. patent application Ser. No. 13/457,079 filed Apr. 26, 2012, and entitled "Device and Methods for High-k and Metal Gate Stacks," the disclosure of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

Field effect transistors (FETs) have been used in conventional IC design. Due to shrinking technology nodes, high-k (HK) dielectric material and metal are often considered to form a gate stack for a FET. Integration issues exist when forming various HK/metal-gate (MG) FETs onto a single IC chip, such as a HK/MG of p-type FET core, n-type FET core, input/output nFET, input/output pFET, and high-resistor. Thus, a process that provides flexibility and feasibility to fabricate various HK/MG structures is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
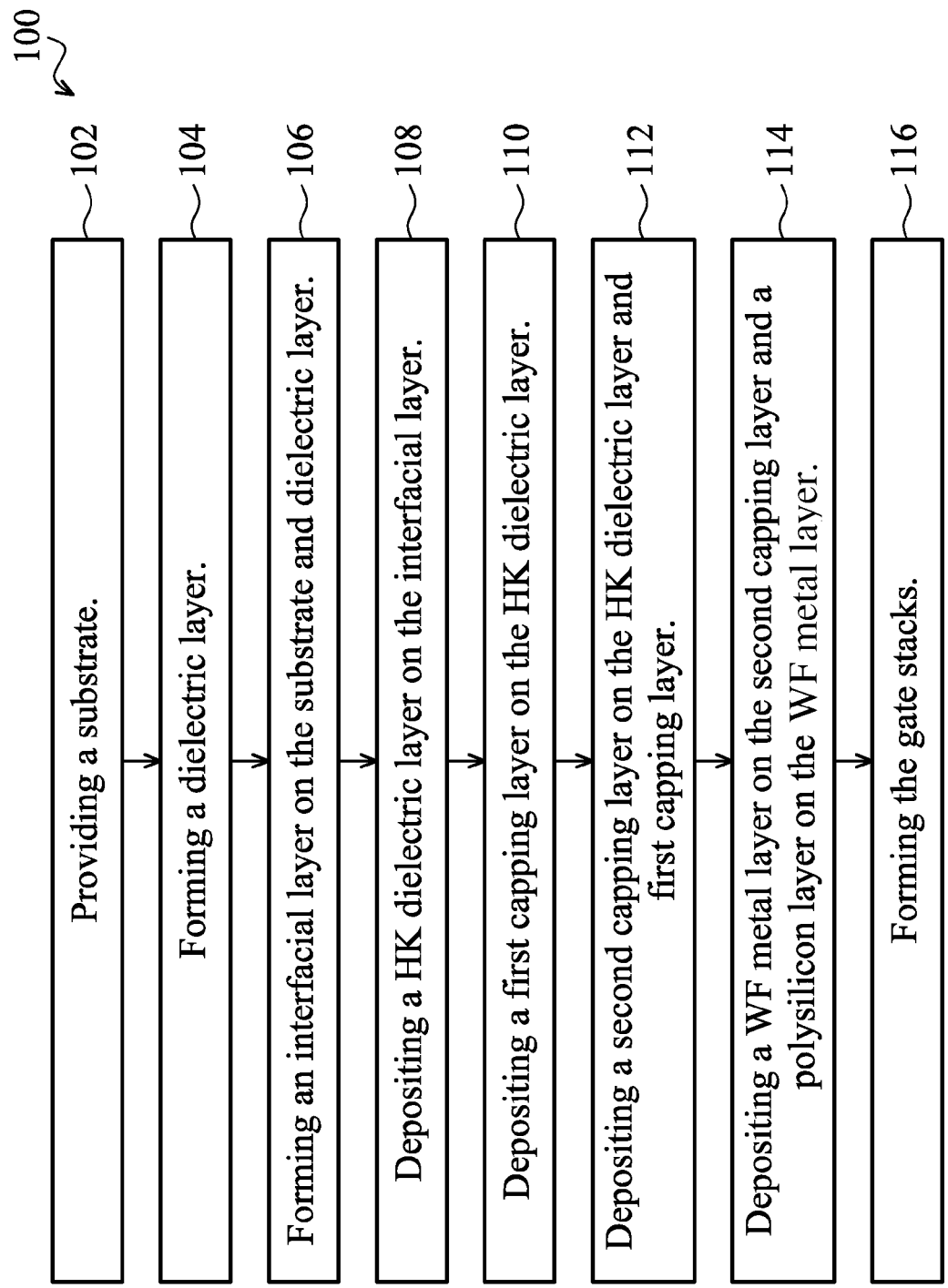
FIG. 1 is a flowchart of a method for making a semiconductor device having various gate stacks in one embodiment constructed according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 9:
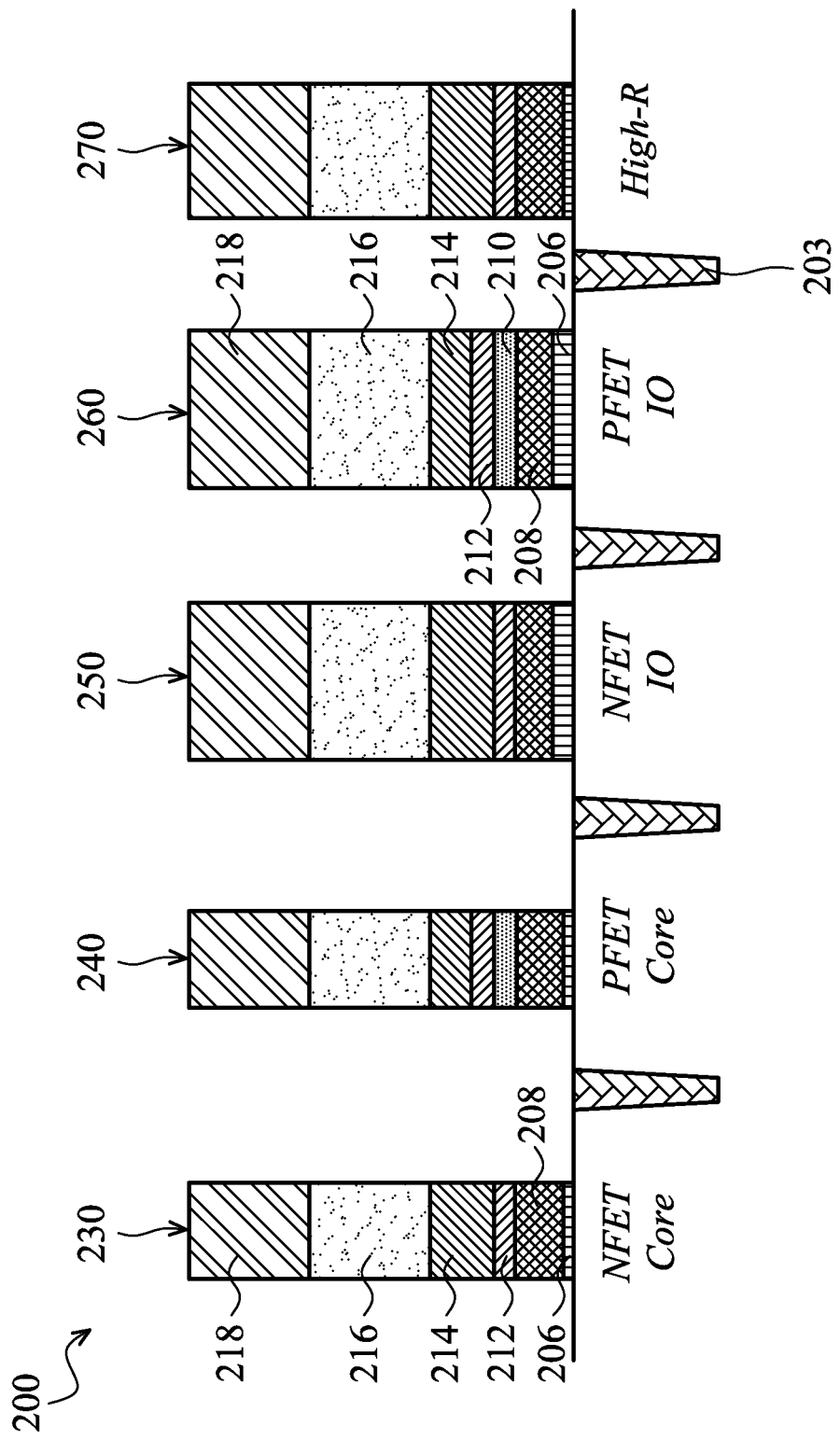
Figure 10:
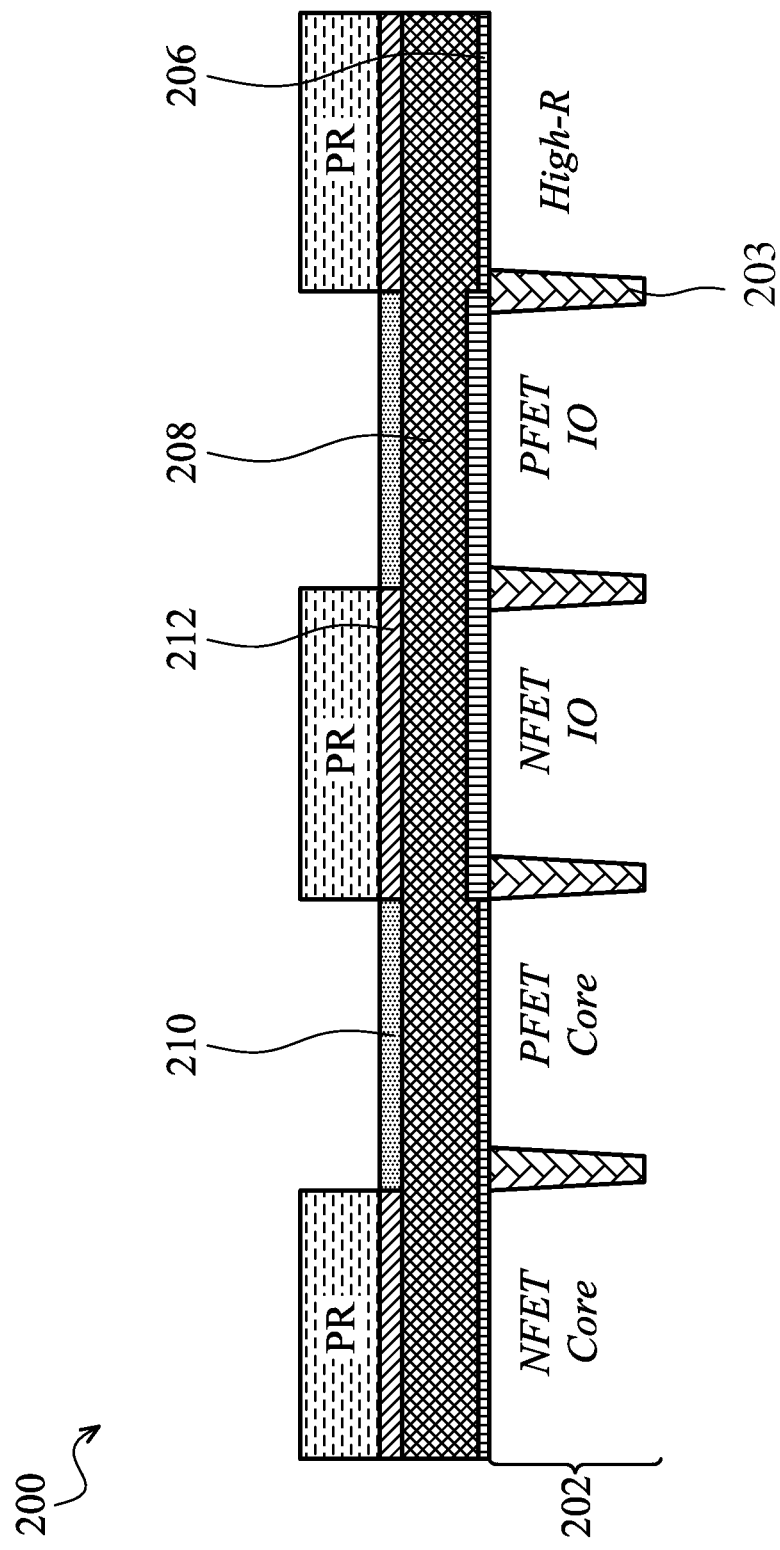
FIGS. 10-12 are sectional view of another embodiment of a semiconductor device having various gate stacks at various fabrication stages constructed according to various aspects of the present disclosure.
Figure 11:
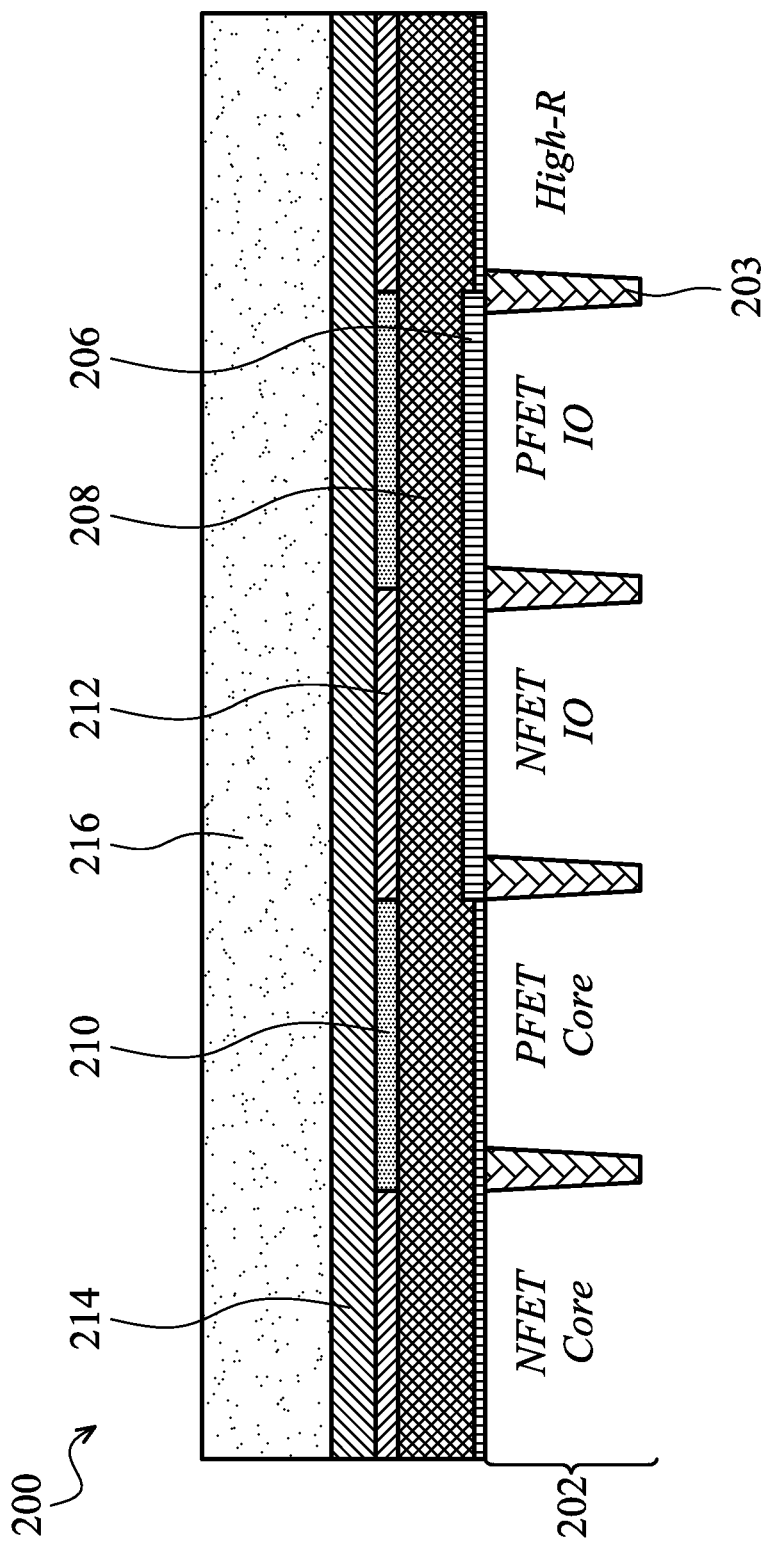
Figure 12:
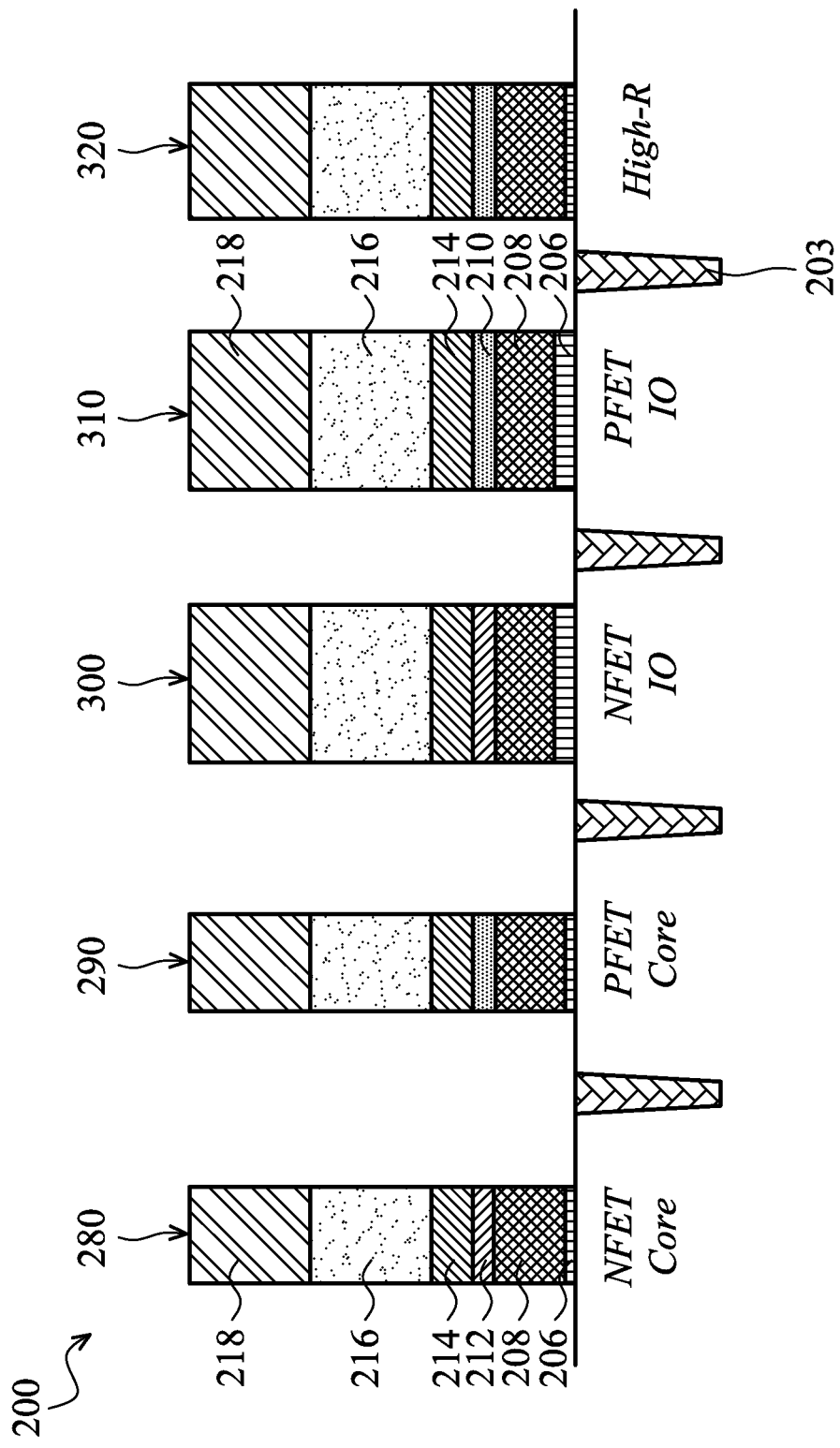
Figure 13:
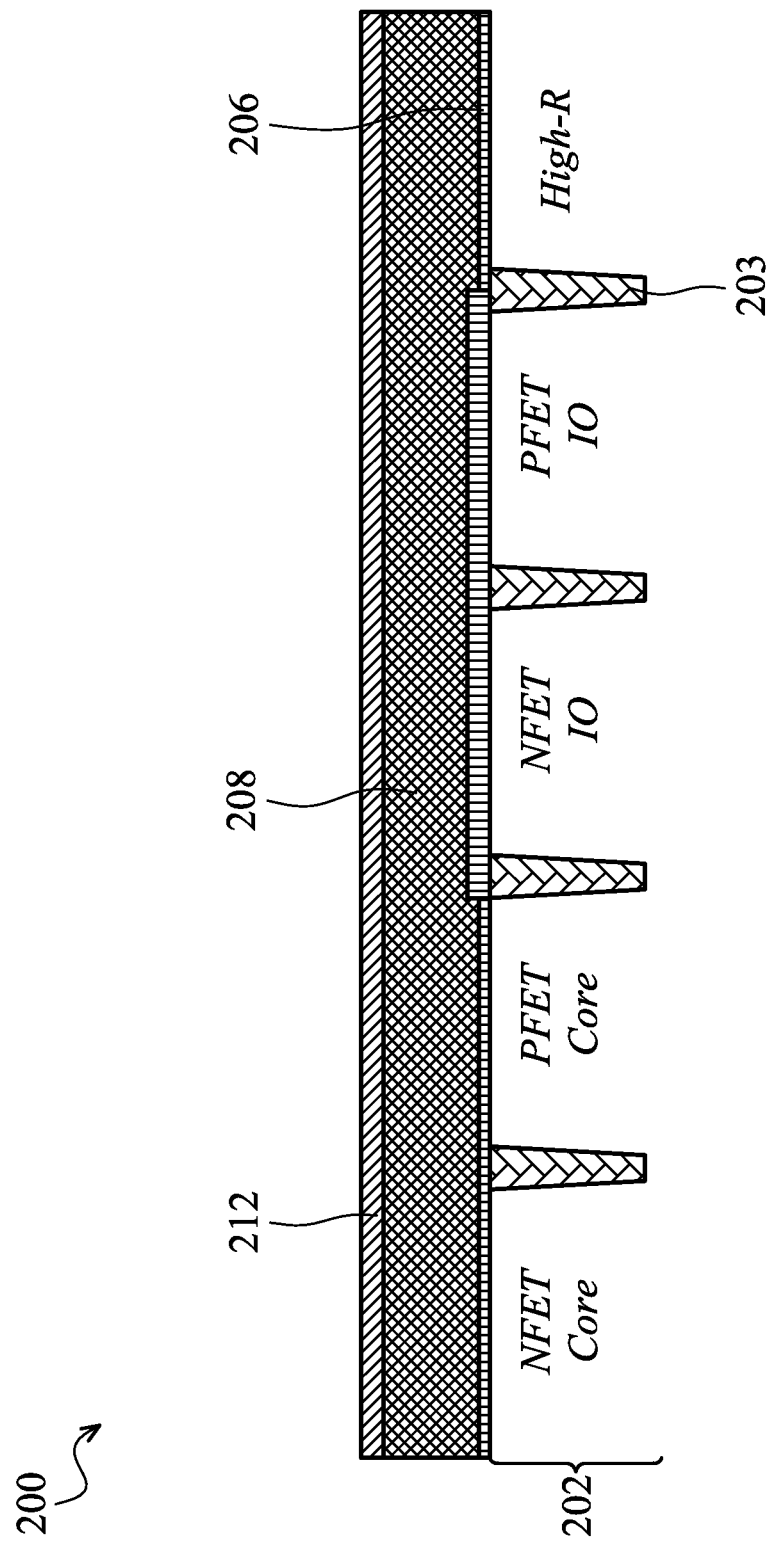
FIGS. 13-14 are sectional views of yet another embodiment of a semiconductor device having various gate stacks at various fabrication stages constructed according to various aspects of the present disclosure.
Figure 14:
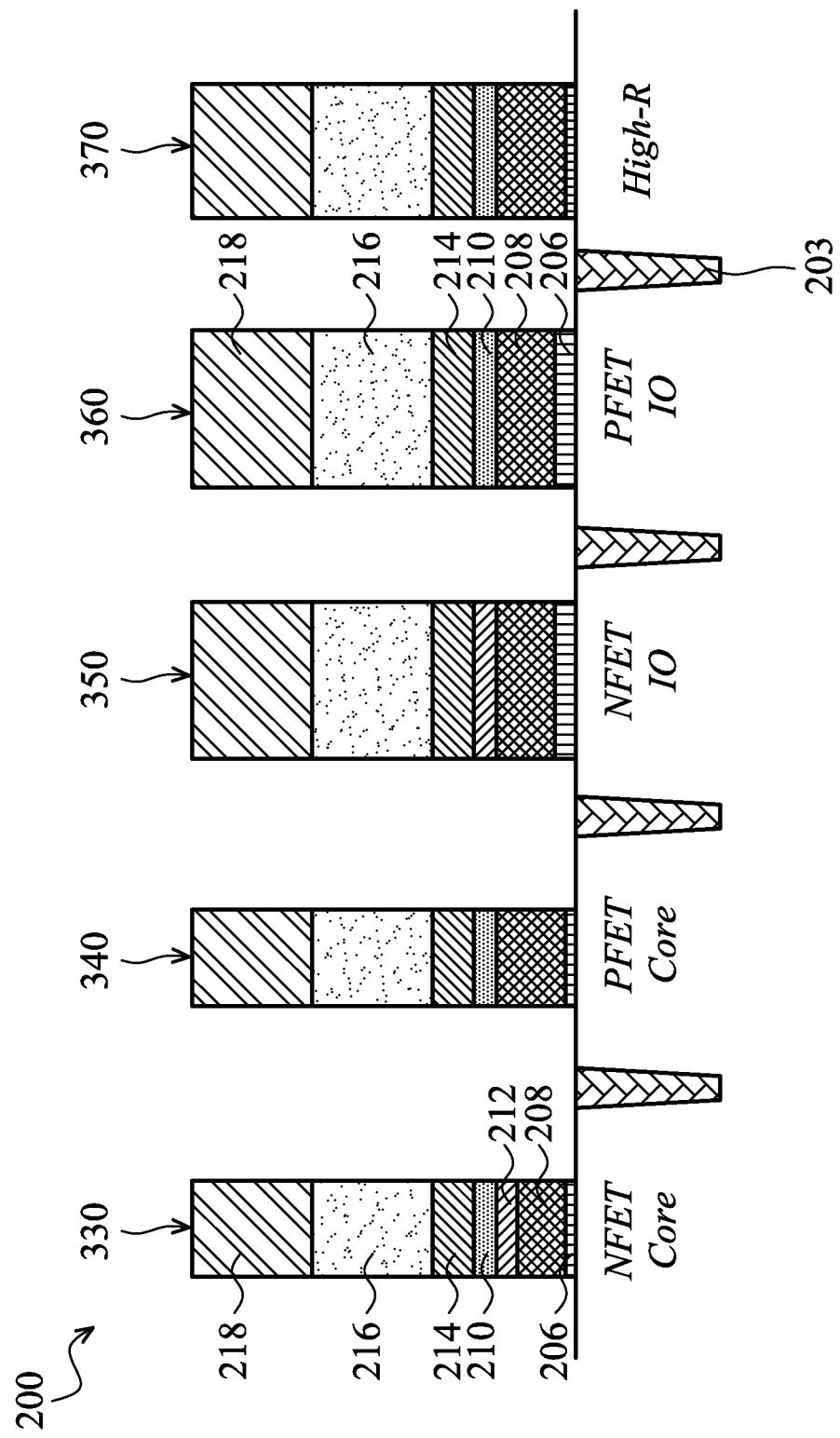
Figure 15:
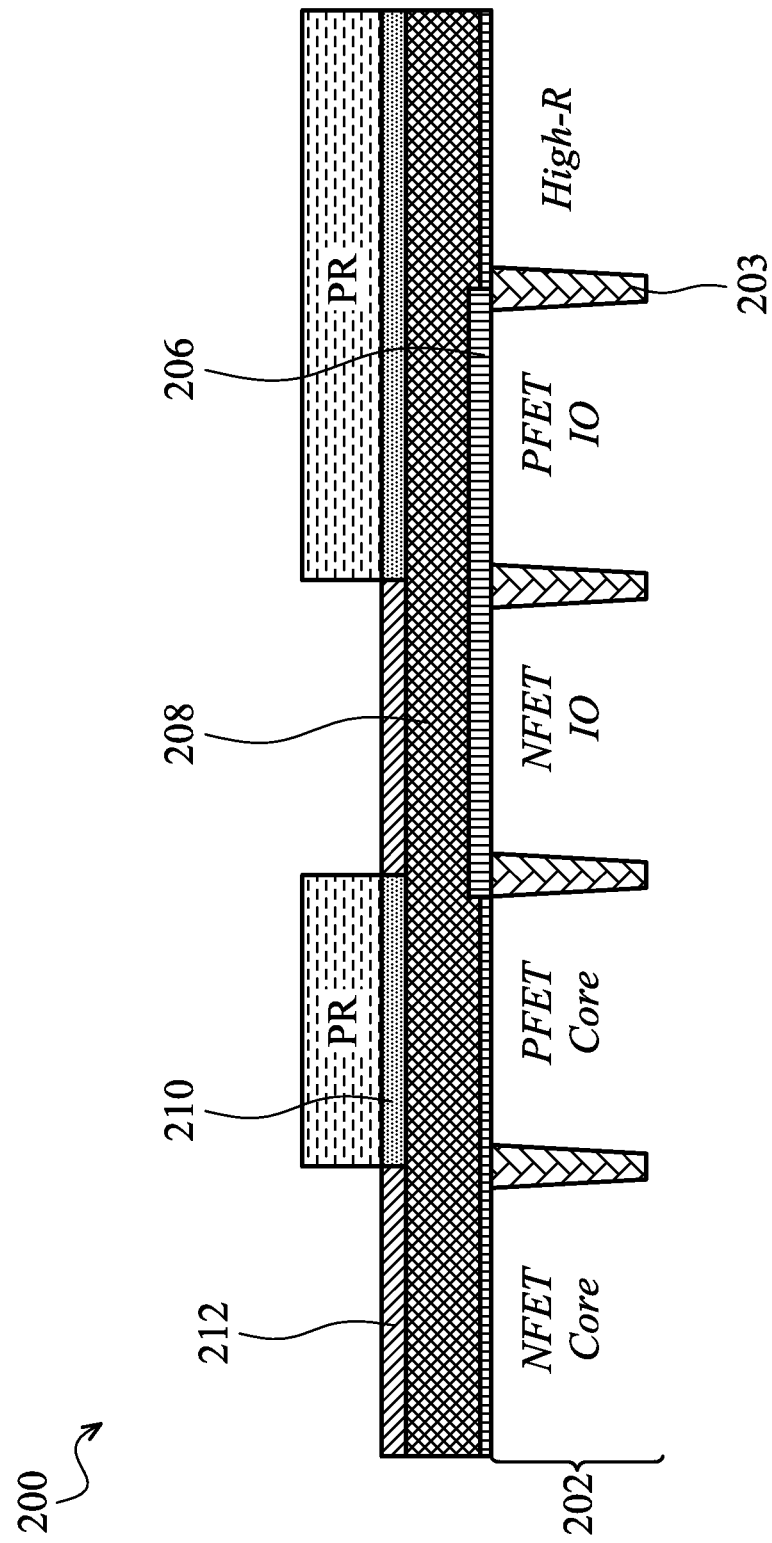
FIG. 15-16 are sectional views of one more embodiment of a semiconductor device having various gate stacks at various fabrication stages constructed according to various aspects of the present disclosure.
Figure 16:
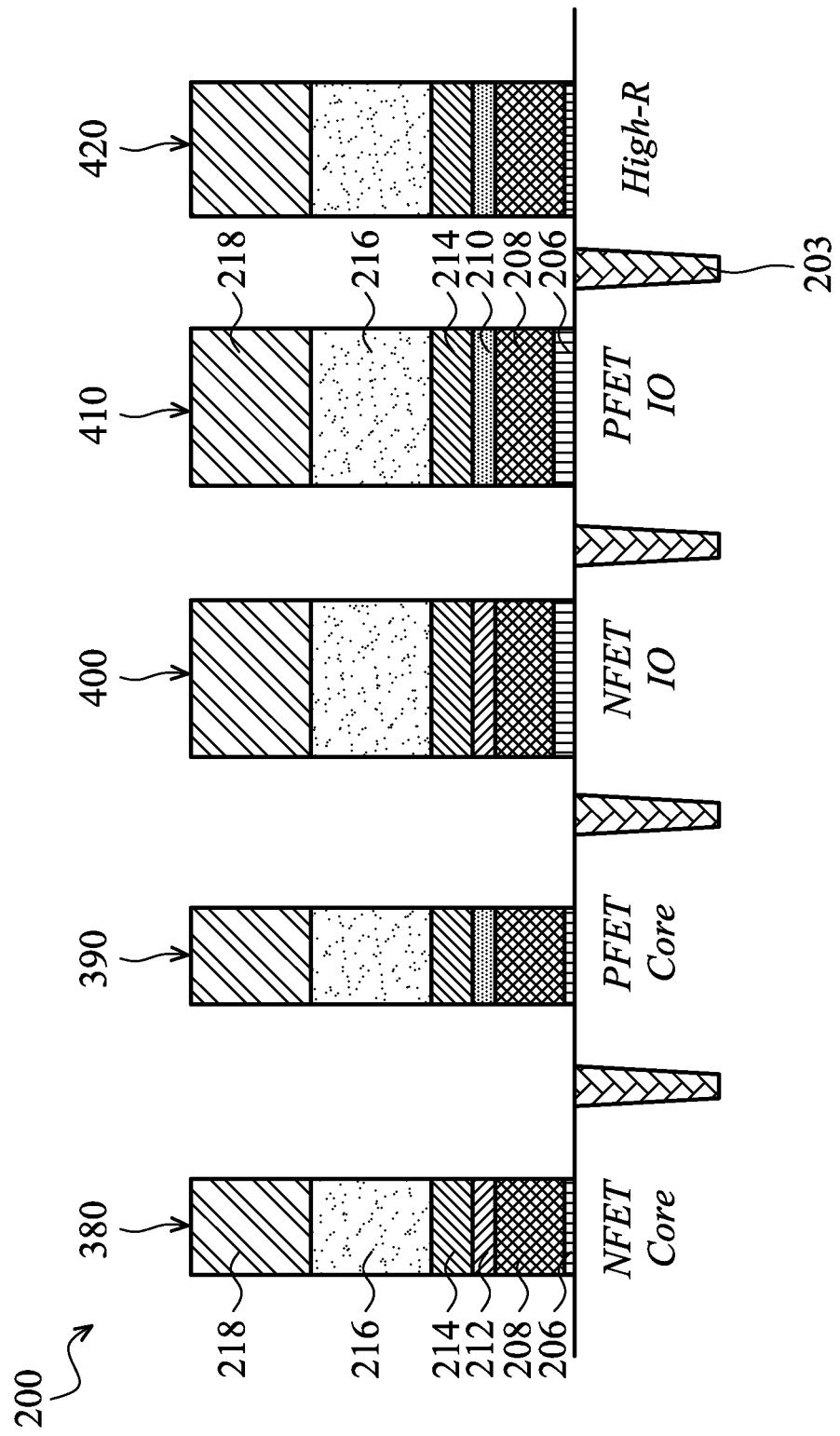

FIG. 1 is a flowchart of one embodiment of a method 100 of making a semiconductor device 200 having gate stacks constructed according to aspects of the present disclosure. FIGS. 2-9 are sectional views of one embodiment of a semiconductor device 200 having gate stacks at various fabrication stages. FIGS. 10-12 are sectional view of another embodiment of a semiconductor device 200. FIGS. 13-14 are sectional views of yet another embodiment of a semiconductor device 200. FIGS. 15-16 are sectional views of a one more embodiment of a semiconductor device 200. The semiconductor device 200 and the method 100 of making the same are collectively described with reference to FIGS. 1 through 16.

The method 100 begins at step 102 by providing a semiconductor substrate 202. The semiconductor substrate 202 includes silicon. Alternatively, the substrate 202 includes germanium or silicon germanium. Also alternatively, the semiconductor substrate 202 may include an epitaxial layer. For example, the semiconductor substrate 202 may have an epitaxial layer overlying a bulk semiconductor. Further, the semiconductor substrate 202 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the semiconductor substrate 202 may include a semiconductor-on-insulator (SOI) structure. Also alternatively, the semiconductor substrate 202 may include a buried dielectric layer, such as a buried oxide (BOX) layer, such as that formed by separation by implantation of oxygen (SIMOX) technology, wafer bonding, SEG, or other appropriate method.

The semiconductor substrate 202 also includes various doped regions such as n-well and p-wells formed by a proper technique, such as ion implantation. The semiconductor substrate also 202 includes various isolation features, such as shallow trench isolation (STI) 203, formed in the substrate to separate various device regions. The formation of the STI 203 may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI 203 may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, and using chemical mechanical planarization (CMP) to polish and planarize.

The semiconductor substrate 202 includes various device regions. The various device regions include various n-type and p-type field effect transistors and one or more resistors. In the present embodiment, the semiconductor substrate 202 includes an n-type field-effect transistor (nFET) core region, an input/output nFET (nFET IO) region, a p-type field-effect transistor (pFET) core region, an input/output pFET (pFET IO) region, and a high-resistor region.

Figure 2:
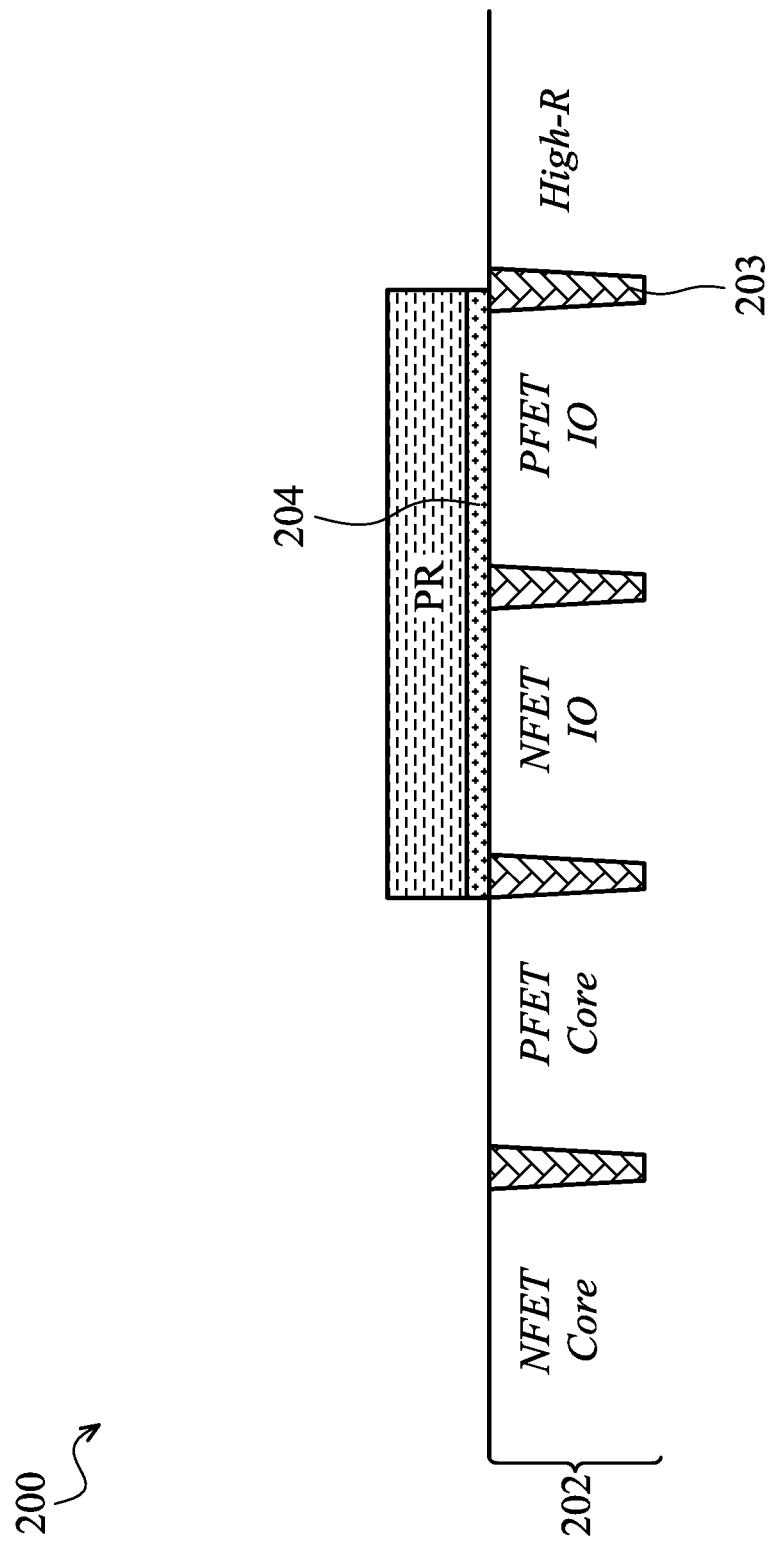
FIGS. 2-9 are sectional views of one embodiment of a semiconductor device having various gate stacks at various fabrication stages constructed according to various aspects of the present disclosure.
Figure 3:
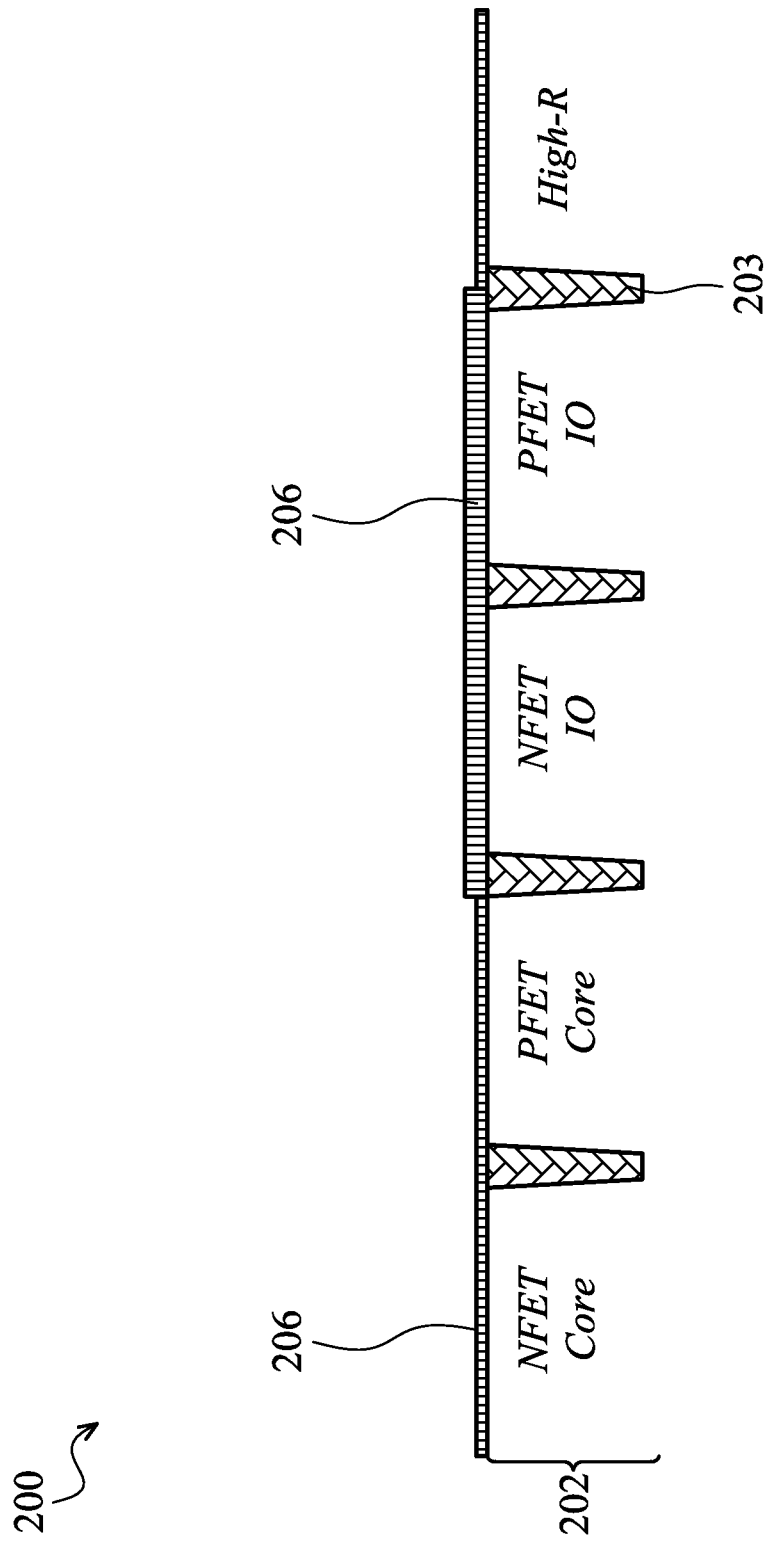

Referring to FIG. 2, the method 100 proceeds to step 104 by forming a dielectric layer 204 on the input/output regions of the semiconductor substrate 202 by suitable techniques, such as depositing, photoresist patterning and etching processes. The dielectric layer 204 includes chemical oxide, or any other suitable materials. In the next step 106 and FIG. 3, an interfacial layer 206 is formed on the substrate 202 and the dielectric layer 204 (not shown). The interfacial layer 206 may include silicon oxide formed by a proper technique, such as an atomic layer deposition (ALD), thermal oxidation, UV-Ozone Oxidation, or chemical vapor deposition (CVD).

Figure 4:
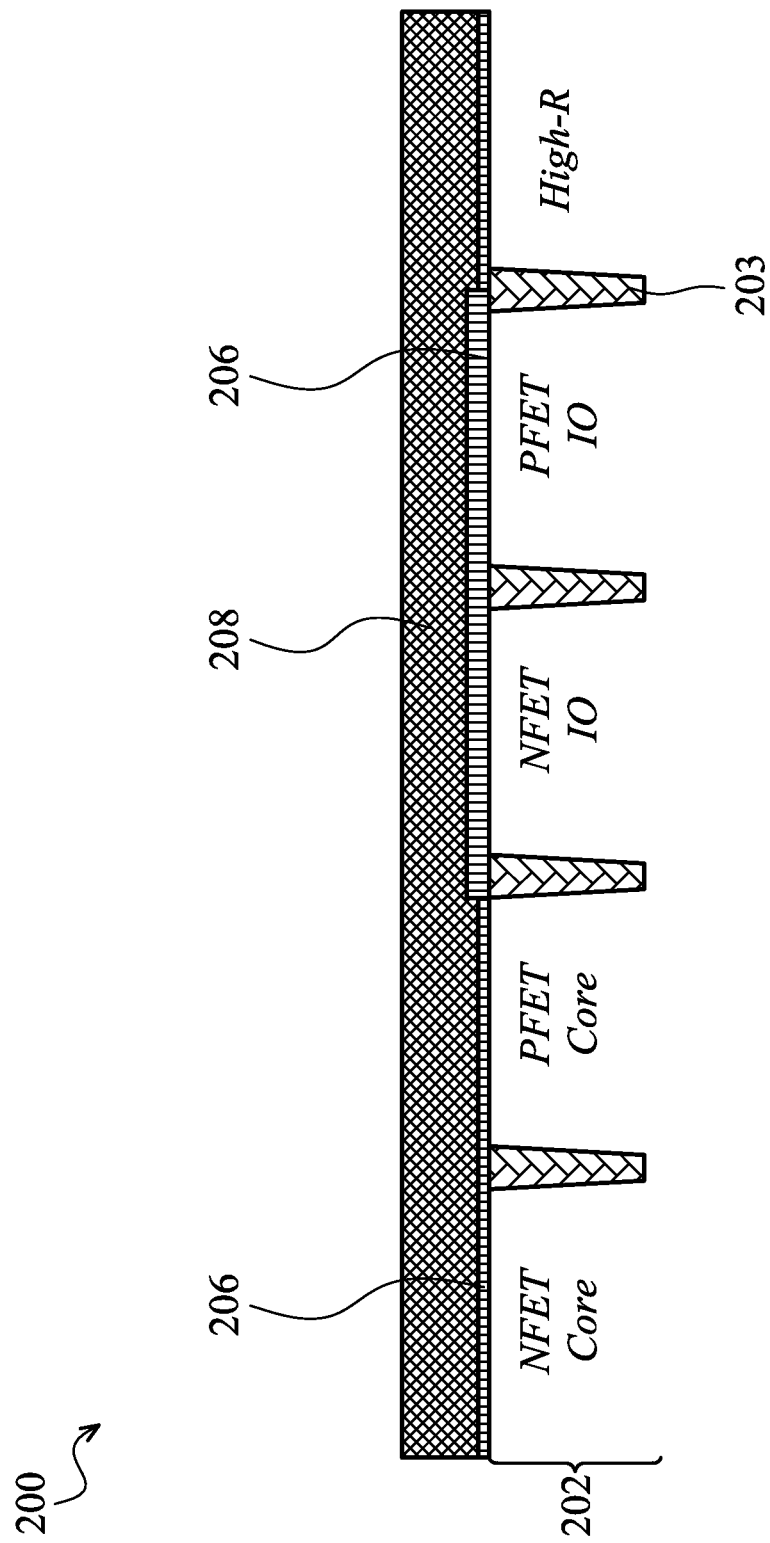

Moving to FIG. 4, in step 108, a high-k (HK) dielectric layer 208 is deposited on the interfacial layer 206. The HK dielectric layer 208 may include HfSiO, HfSiON, HfTaO, HfTiO, HfZrO, zirconium oxide, aluminum oxide, hafnium dioxide-alumina ($HfO_2$—$Al_2O_3$) alloy, other suitable HK dielectric materials, or combinations thereof. The HK dielectric layer 208 is formed by a suitable process such as ALD, PVD, or CVD. Other methods to form the HK dielectric layer 208 include metal organic chemical vapor deposition (MOCVD) or UV-Ozone Oxidation or molecular beam epitaxy (MBE). In one embodiment, the HK dielectric layer 208 has a thickness of less than 50 angstroms.

Figure 5:
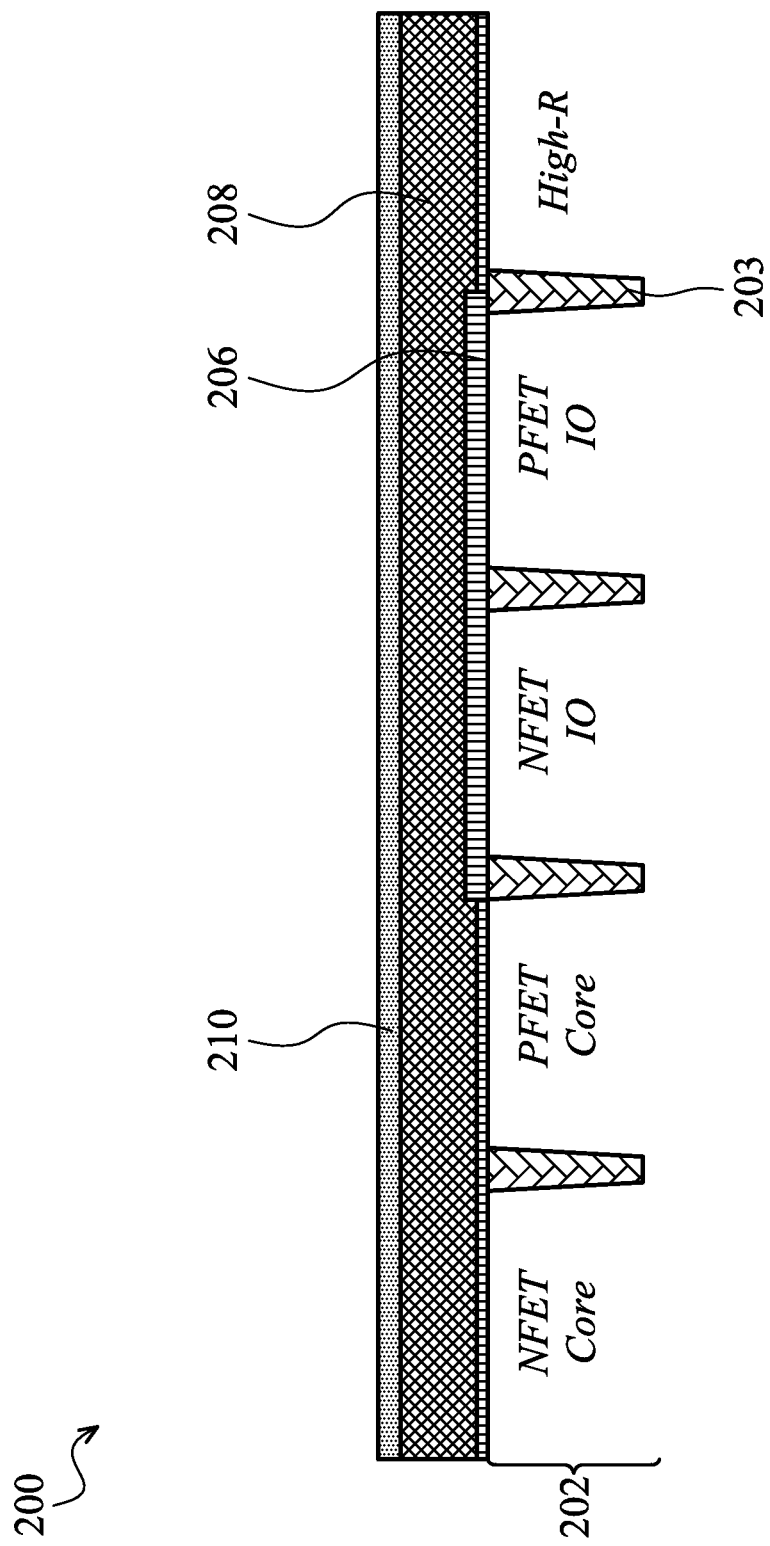

Referring to FIG. 5 and step 110, a capping layer of a first material 210 is deposited on the HK dielectric layer 208. The capping layer 210 may include a p-type work function metal or metal oxide, including $Al_2O_3$, MgO, CaO, or mixtures thereof. In the present embodiment, capping layer 210 includes aluminum oxide. The capping layer 210 is formed by a suitable technique, such as ALD, CVD, or physical vapor deposition (PVD). In one embodiment, the capping layer 210 has a thickness of less than 50 angstroms.

Figure 6:
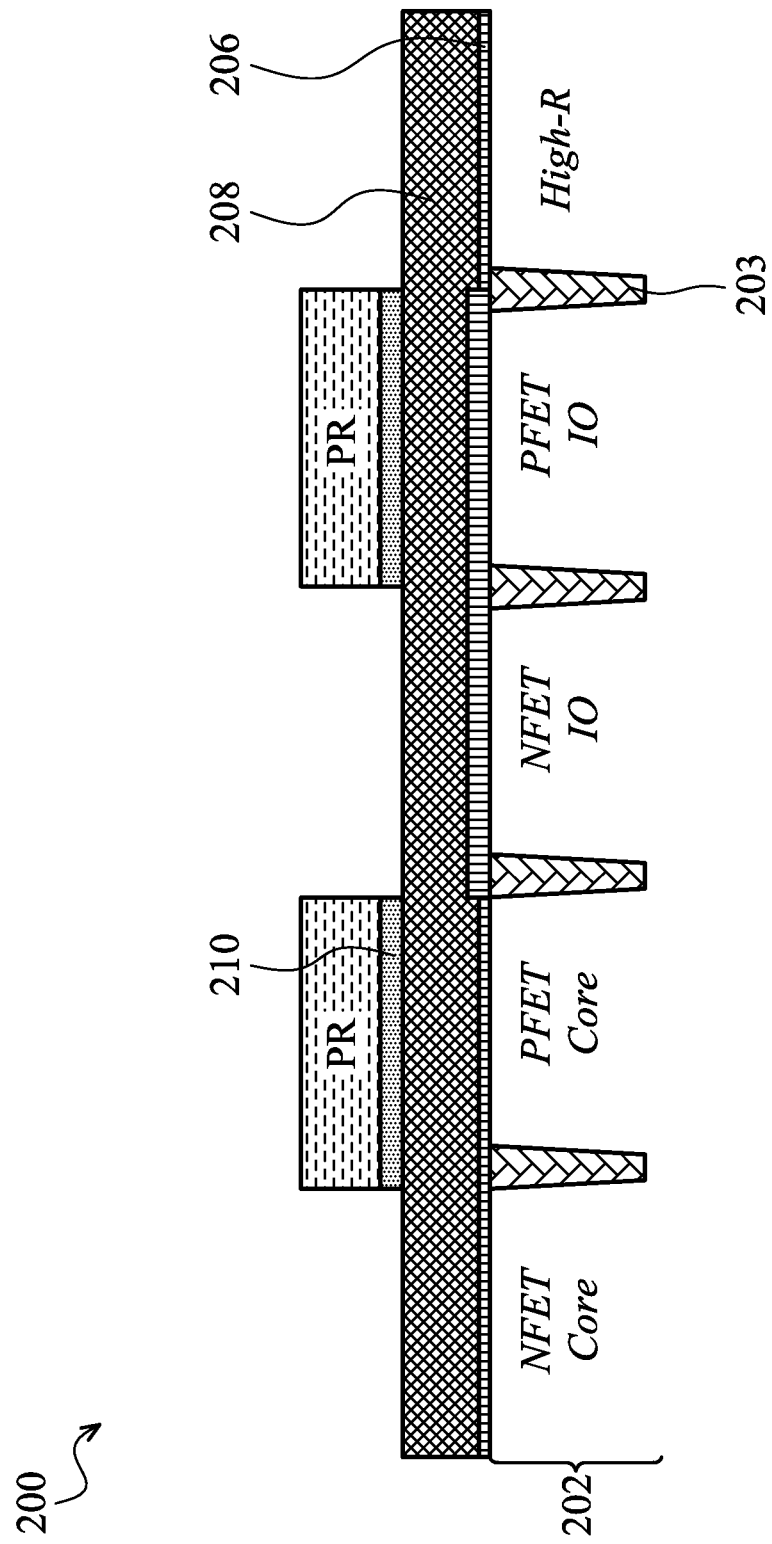

In FIG. 6, the capping layer 210 is patterned using lithography and etching processes so as to remove the capping layer 210 from the nFET core region, nFET IO region, and high-resistor region of the substrate 202. An exemplary lithography process may include photoresist patterning, developing, and photoresist stripping. In this process, a patterned photoresist layer is formed on capping layer 210. The patterned photoresist layer includes various openings that expose portions of the capping layer 210 to subsequent etch. The etching process includes a dry etch, a wet etch, or a combination of dry etch and wet etch. The dry etching process may implement a, fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), iodine-containing gas, other suitable gases and/or plasmas, and/or combinations thereof. The etching process may include a multiple-step etching to gain etch selectivity, flexibility and desired etch profile.

Figure 7:
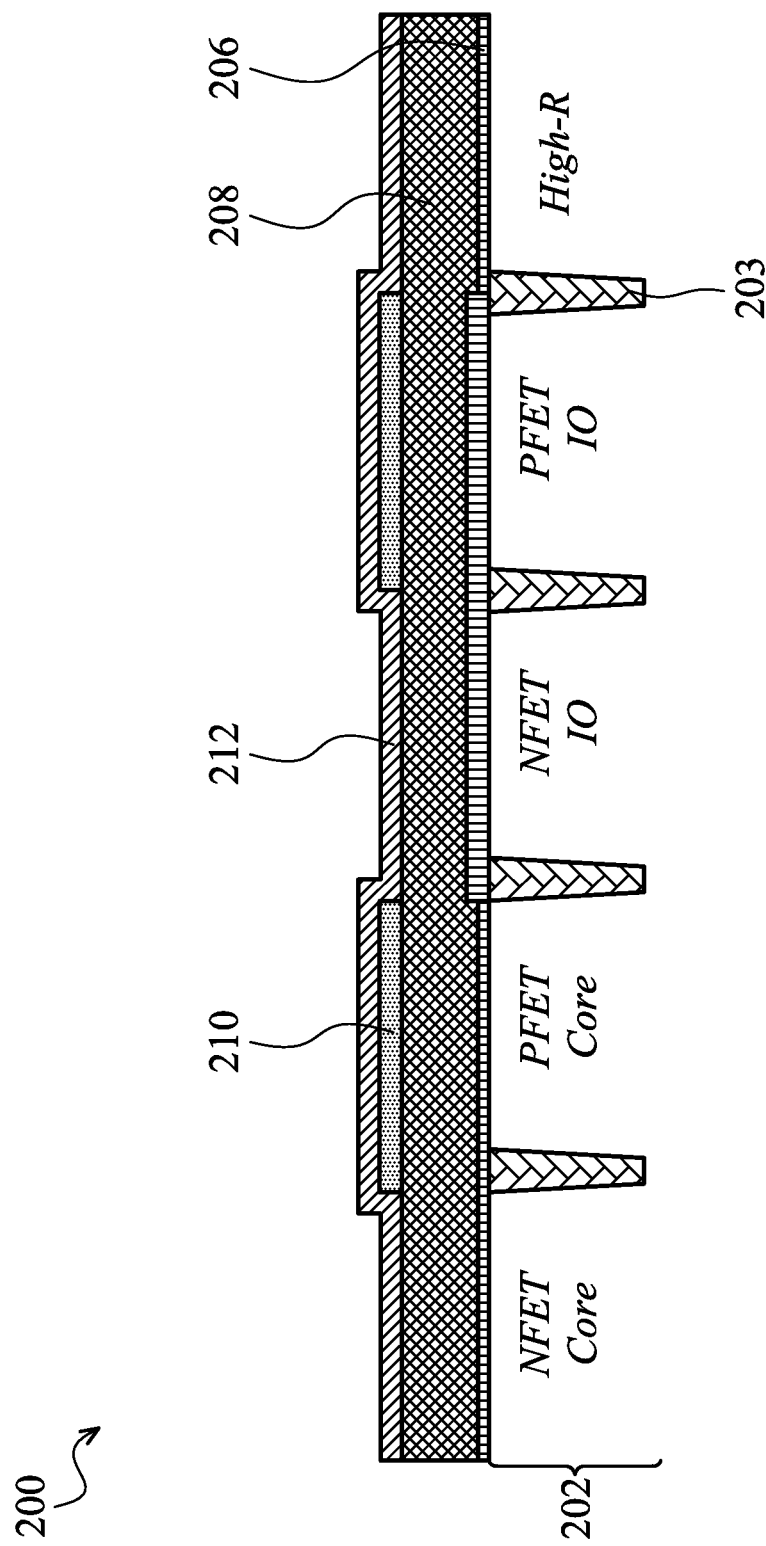

In FIG. 7 and step 112, a capping layer of a second material 212 is deposited on the HK dielectric layer 208 in the nFET core region, nFET IO region, and high-resistor region, and on the capping layer of the first material 210 in the pFET core region and pFET IO region. The capping layer 212 may include an n-type work function metal or metal oxide, including $La_2O_3$, $Sc_2O_3$, $Y_2O_3$, SrO, BaO, $Ta_2O_5$, $TiO_2$, $LaAlO_3$, $ZrO_2$, $Gd_2O_3$, or mixtures thereof. In the present embodiment, capping layer 212 includes lanthanum oxide. The capping layer 212 is formed by a suitable technique, such as ALD, CVD, or PVD. In one embodiment, the capping layer 212 has a thickness of less than 50 angstroms.

Figure 8:
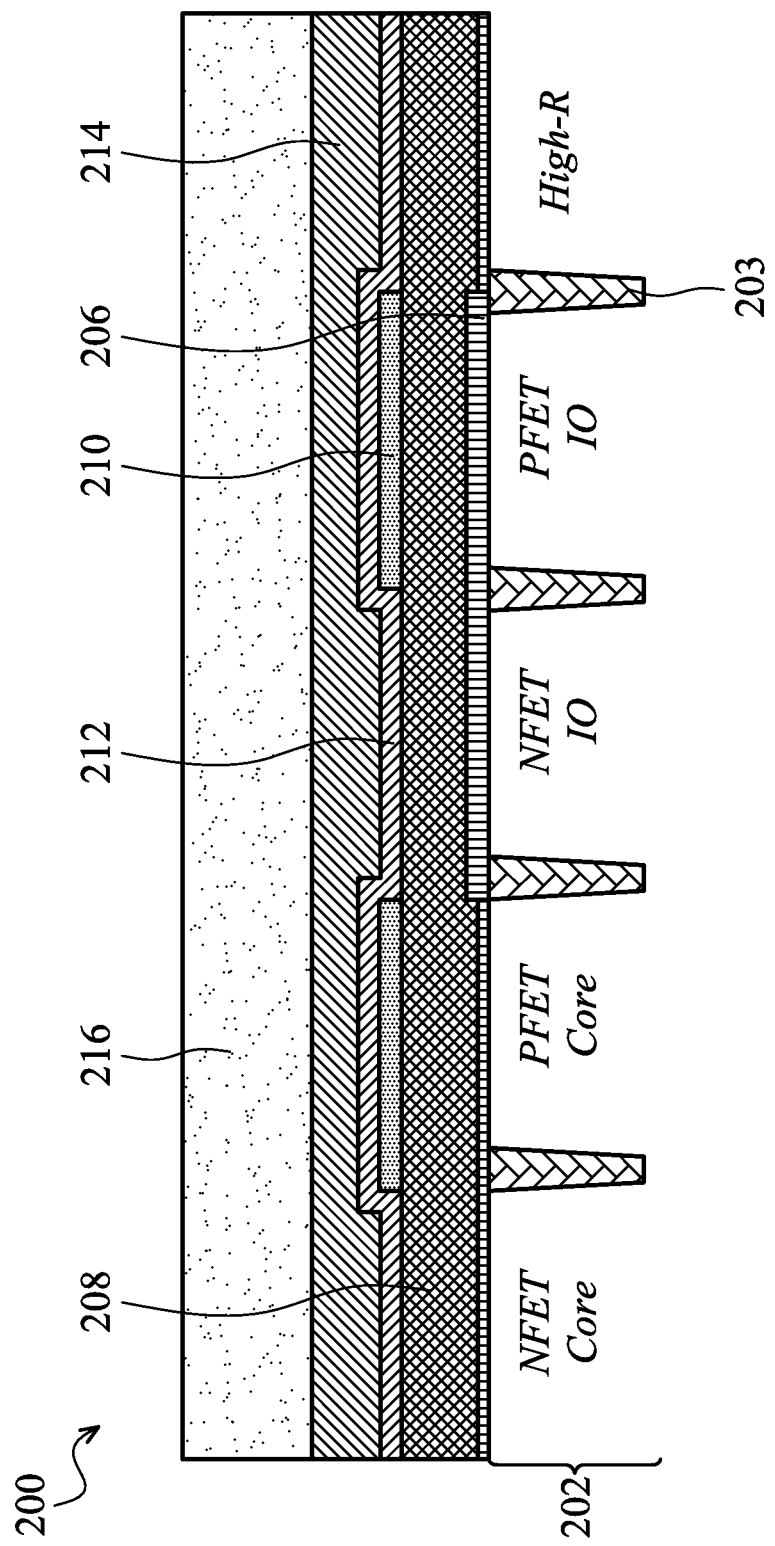

Proceeding to step 114 and FIG. 8, a work function (WF) metal layer 214 is deposited on the capping layer 212 and a polysilicon layer 216 is deposited on the WF metal layer 214. In the present embodiment, the WF metal layer 214 includes titanium nitride (TiN) formed by a suitable technique, such as PVD, ALD, or CVD. In other embodiments, the WF metal layer 214 includes tantalum nitride (TaN), tungsten nitride (WN), or combinations thereof. In one embodiment, the WF metal layer 214 has a thickness of less than 200 angstroms.

The polysilicon (or amorphous silicon) layer 216 may be formed by CVD with precursor silane ($SiH_4$) or other silicon based precursor. The deposition of the amorphous silicon may be performed at a raised temperature. In one example, the deposition temperature is greater than about 400° C. The polysilicon (or amorphous) layer 216 may be in situ doped using the precursor including dopant-containing gas according to one embodiment.

The method 100 proceeds to step 116 by forming the different gate stacks by a patterning and etching process. In FIG. 9, the gate layers are patterned to form five different gate stacks including a first gate stack 230 on the nFET core region, a second gate stack 240 on the pFET core region, a third gate stack 250 on the nFET 10 region, a fourth gate stack 260 on the pFET IO region, and a fifth gate stack 270 on the high-resistor region. In the present embodiment, the first gate stack 230 includes, in order from bottom to top, interfacial layer 206, HK dielectric layer 208, capping layer of the second material 212, WF metal layer 214, and polysilicon layer 216. The second gate stack 240 includes, in order from bottom to top, interfacial layer 206, HK dielectric layer 208, capping layer of the first material 210, capping layer of the second material 212, WF metal layer 214, and polysilicon layer 216. The third gate stack 250 includes, in order from bottom to top, dielectric layer 204 (not shown), interfacial layer 206, HK dielectric layer 208, capping layer of the second material 212, WF metal layer 214, and polysilicon layer 216. The fourth gate stack 260 includes, in order from bottom to top, dielectric layer 204 (not shown), interfacial layer 206, HK dielectric layer 208, capping layer of the first material 210, capping layer of the second material 212, WF metal layer 214, and polysilicon layer 216. The fifth gate stack 270 includes, in order from bottom to top, interfacial layer 206, HK dielectric layer 208, capping layer of the second material 212, WF metal layer 214, and polysilicon layer 216.

The patterning processes to form the gate stacks includes lithography patterning and etching processes. For example, the lithography patterning process includes forming a patterned photoresist, developing a photoresist, and photoresist stripping. In another embodiment, as seen in FIG. 9, the etching process may further use a hard mask layer 218 as an etch mask. In this case, a hard mask layer 218 is formed on the gate layers, a patterned photoresist layer (not shown) is formed on the hard mask layer 218, a first etch process is applied to the hard mask layer 218 to transfer the pattern from the patterned photoresist to the hard mask layer 218, and a second etch process is applied to the gate layers using the patterned hard mask as an etch mask. The hard mask layer 218 may include silicon nitride and/or silicon oxide.

As seen in FIG. 9, the second and fourth gate stacks 240, 260 on the pFET core and pFET IO regions respectively, include both capping layers of the first and second material 210, 212. The capping layer of the first material 210, which may have the p-type work function is in closer proximity to the substrate 202. The capping layer of the second material 212, which may have the n-type work function, is above capping layer 210, and farther from the substrate 202.

FIGS. 10 to 12 illustrate another embodiment of a method of making a semiconductor device 200. In this embodiment, an seen in FIG. 10, extra steps are included. Before depositing the WF metal layer 114 in step 114, the capping layer of the second material 212 is removed from the pFET core region and pFET IO region by using a photolithography and etching processes. The steps following this additional step (deposition of WF metal layer 214 and polysilicon layer 216) are substantially the same as those previously described for FIG. 8, and are shown in FIG. 11.

FIG. 12 illustrates the fabrication of the different gate stacks by a patterning and etching process. Similar to FIG. 9, the gate layers are patterned to form five different gate stacks including a first gate stack 280 on the nFET core region, a second gate stack 290 on the pFET core region, a third gate stack 300 on the nFET IO region, a fourth gate stack 310 on the pFET IO region, and a fifth gate stack 320 on the high-resistor region.

In the present embodiment, the first gate stack 280 includes, in order from bottom to top, interfacial layer 206, HK dielectric layer 208, capping layer of the second material 212, WF metal layer 214, and polysilicon layer 216. The second gate stack 290 includes, in order from bottom to top, interfacial layer 206, HK dielectric layer 208, capping layer of the first material 210, WF metal layer 214, and polysilicon layer 216. The third gate stack 300 includes, in order from bottom to top, dielectric layer 204 (not shown), interfacial layer 206, HK dielectric layer 208, capping layer of the second material 212, WF metal layer 214, and polysilicon layer 216. The fourth gate stack 310 includes, in order from bottom to top, dielectric layer 204 (not shown), interfacial layer 206, HK dielectric layer 208, capping layer of the first material 210, WF metal layer 214, and polysilicon layer 216. The fifth gate stack 320 includes, in order from bottom to top, interfacial layer 206, HK dielectric layer 208, capping layer of the second material 212, WF metal layer 214, and polysilicon layer 216.

Referring now to FIG. 13, another embodiment of method 100 is described. The method 100 proceeds through steps 102-106 as previously described with reference to FIGS. 1-3. In this embodiment, the method is substantially the same as the method described with respect to FIGS. 4-8, except that the positions of the capping layer of the first material 210 and capping layer of the second material 212 in the process flow are reversed. For example, FIG. 13 is the same as FIG. 5, but capping layer 212 is deposited first instead of capping layer 210. Also, in this embodiment, the capping layer 212 is removed from the pFET core and pFET IO regions instead of from the nFET core and nFET IO regions as was the case for capping layer 210 in FIG. 6. The method proceeds through steps 108-114 as previously described.

At step 116 and FIG. 14, different gate stacks are formed by a patterning and etching process as previously described. The gate layers are patterned to form five different gate stacks including a first gate stack 330 on the nFET core region, a second gate stack 340 on the pFET core region, a third gate stack 350 on the nFET IO region, a fourth gate stack 360 on the pFET IO region, and a fifth gate stack 370 on the high-resistor region.

In the present embodiment, the first gate stack 330 includes, in order from bottom to top, interfacial layer 206, HK dielectric layer 208, capping layer of the second material 212, capping layer of the first material 210, WF metal layer 214, and polysilicon layer 216. The second gate stack 340 includes, in order from bottom to top, interfacial layer 206, HK dielectric layer 208, capping layer of the first material 210, WF metal layer 214, and polysilicon layer 216. The third gate stack 350 includes, in order from bottom to top, dielectric layer 204 (not shown), interfacial layer 206, HK dielectric layer 208, capping layer of the second material 212, capping layer of the first material 210, WF metal layer 214, and polysilicon layer 216. The fourth gate stack 360 includes, in order from bottom to top, dielectric layer 204 (not shown), interfacial layer 206, HK dielectric layer 208, capping layer of the first material 210, WF metal layer 214, and polysilicon layer 216. The fifth gate stack 370 includes, in order from bottom to top, interfacial layer 206, HK dielectric layer 208, capping layer of the first material 210, WF metal layer 214, and polysilicon layer 216.

As seen in FIG. 14, the first and third gate stacks 330, 350 on the nFET core and nFET IO regions respectively, include both capping layers of the first and second material 210, 212. The capping layer of the second material 212, which may have the n-type work function is in closer proximity to the substrate 202. The capping layer of the first material 210, which may have the p-type work function, is above the capping layer 212, and farther from the substrate 202.

FIGS. 15-16 illustrate another embodiment of a method of making a semiconductor device 200. In this embodiment, the method is substantially the same as the method described with respect to FIGS. 10-11, except that the positions of the capping layer of the first material 210 and capping layer of the second material 212 in the process flow are reversed. In this embodiment, the capping layer 210 is removed from the nFET core and nFET core regions instead of from the pFET core and pFET IO regions as was the case for capping layer 212 in FIG. 10.

FIG. 16 illustrates the fabrication of the different gate stacks by a patterning and etching process. Similar to FIG. 14, the gate layers are patterned to form five different gate stacks including a first gate stack 380 on the nFET core region, a second gate stack 390 on the pFET core region, a third gate stack 400 on the nFET IO region, a fourth gate stack 410 on the pFET IO region, and a fifth gate stack 420 on the high-resistor region.

In the present embodiment, the first gate stack 380 includes, in order from bottom to top, interfacial layer 206, HK dielectric layer 208, capping layer of the second material 212, WF metal layer 214, and polysilicon layer 216. The second gate stack 390 includes, in order from bottom to top, interfacial layer 206, HK dielectric layer 208, capping layer of the first material 210, WF metal layer 214, and polysilicon layer 216. The third gate stack 400 includes, in order from bottom to top, dielectric layer 204 (not shown), interfacial layer 206, HK dielectric layer 208, capping layer of the second material 212, WF metal layer 214, and polysilicon layer 216. The fourth gate stack 410 includes, in order from bottom to top, dielectric layer 204 (not shown), interfacial layer 206, HK dielectric layer 208, capping layer of the first material 210, WF metal layer 214, and polysilicon layer 216. The fifth gate stack 420 includes, in order from bottom to top, interfacial layer 206, HK dielectric layer 208, capping layer of the first material 210, metal layer 214, and polysilicon layer 216.

Various advantages may be present in one or more embodiments of the method 100 and the semiconductor device 200. The present disclosure provides a new integration scheme for a gate first process design. The methods provide four kinds of process flows that may be used to fabricate various kinds of semiconductor devices. The methods are flexible because they allow different devices to be fabricated by changing the sequence of the n/p capping layer deposition and patterning. The methods are efficient because a variety of gate stacks can be formed at the same time, i.e., layers of the same material for each gate stack are deposited at the same time. The present methods and devices provide a feasible integration flow that can integrate CMOS devices with Core/IO/Resistors and maintain the reasonable threshold voltage of NMOS and PMOS at the same time.

One of the broader forms of the present disclosure relates to a semiconductor device. The device includes a substrate and isolation features to separate different regions on the substrate. The device further includes five different gate stacks on the different regions. A p-type field-effect transistor (pFET) core region has a first gate stack on the substrate that includes an interfacial layer, a high k (HK) dielectric layer on the interfacial layer, and a capping layer of a first material on the HK dielectric layer. An input/output pFET (pFET IO) region has a second gate stack that includes a dielectric layer, an interfacial layer on the dielectric layer, a HK dielectric layer on the interfacial layer, and a capping layer of a first material on the HK dielectric layer. An n-type field-effect transistor (nFET) core region has a third gate stack on the substrate that includes an interfacial layer, a HK dielectric layer on the interfacial layer, and a capping layer of a second material on the interfacial layer. An input/output nFET (nFET IO) region has a fourth gate stack that includes a dielectric layer, an interfacial layer on the dielectric layer, a HK dielectric layer on the interfacial layer, and a capping layer of the second material on the HK dielectric layer. A high-resistor region has a fifth gate stack that includes an interfacial layer, a HK dielectric layer on the interfacial layer, and a capping layer of the second material on the interfacial layer.

Another one of the broader forms of the present disclosure involves another semiconductor device. The device includes a semiconductor substrate and isolation features to separate different regions on the substrate. The device further includes five different gate stacks on the different regions. A p-type field-effect transistor (pFET) core region has a first gate stack that includes an interfacial layer, a high k (HK) dielectric layer on the interfacial layer, and a capping layer of a first material on the HK dielectric layer. An input/output pFET (pFET IO) region has a second gate stack that includes a dielectric layer, an interfacial layer on the dielectric layer, a HK dielectric layer on the interfacial layer, and a capping layer of the first material on the HK dielectric layer. A high-resistor has a third gate stack that includes an interfacial layer, a HK dielectric layer on the interfacial layer, and a capping layer of the first material on the HK dielectric layer. An n-type field-effect transistor (nFET) core region has a fourth gate stack that includes an interfacial layer, a HK dielectric layer on the interfacial layer, and a capping layer of a second material on the HK dielectric layer. An input/output nFET (nFET IO) region has a fifth gate stack that includes a dielectric layer, an interfacial layer on the dielectric layer, a HK dielectric layer on the interfacial layer, and a capping layer of a second material on the HK dielectric layer.

The present disclosure also describes a method of fabricating a semiconductor device. The method includes providing a semiconductor substrate having regions for an n-type field-effect transistor (nFET) core, an input/output nFET (nFET IO), a p-type field-effect transistor (pFET) core, an input/output pFET (pFET IO), and a high-resistor, forming an oxide layer on the IO region of the substrate, forming an interfacial layer on the substrate and the oxide layer, depositing a high-k (HK) dielectric layer on the interfacial layer, depositing a capping layer of a first material on the HK dielectric layer, depositing a capping layer of a second material on the HK dielectric layer and on the capping layer of the first material, depositing a work function (WF) metal layer on the capping layer of the second material, depositing a polysilicon layer on the WF metal layer, and forming gate stacks on the regions of the substrate.

Other process steps may be implemented before, during and/or after the method 100. The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for fabricating a semiconductor device, the method comprising:
   providing a semiconductor substrate having regions for an n-type field-effect transistor (nFET) core, an input/output nFET (nFET IO), a p-type field-effect transistor (pFET) core, an input/output pFET (pFET IO), and a high-resistor;
   forming an oxide layer directly on the IO regions of the substrate;
   forming an interfacial layer on the substrate in regions for the nFET core and pFET core and directly on the oxide layer in the regions for the nFET IO and pFET IO;
   depositing a high-k (HK) dielectric layer on the interfacial layer;
   depositing a first capping layer of a first material on the HK dielectric layer;
   depositing a second capping layer of a second material on the HK dielectric layer and on the first capping layer;
   depositing a work function (WF) metal layer on the second capping layer;
   depositing a polysilicon layer on the WF metal layer; and
   forming gate stacks on the regions of the substrate.

2. The method of claim 1, further comprising removing the first material of the first capping layer from the nFET core, nFET IO, and high-resistor regions before depositing the second capping layer.

3. The method of claim 1, further comprising removing the second material of the second capping layer from the pFET core and pFET IO regions before depositing the WF metal layer.

4. The method of claim 1, further comprising removing the second capping layer from the nFET core and nFET IO regions before depositing the WF metal layer.

5. The method of claim 1, wherein the first and second materials comprises a p-type or n-type work function metal or metal oxide.

6. The method of claim 1, wherein the HK dielectric layer is formed below the capping layer of the first material or second material.

7. The method of claim 1, wherein forming the gate stacks comprises forming a hard mask layer on the polysilicon layer.

8. A method comprising:
providing a semiconductor substrate;
forming a first gate stack on the substrate over a p-type field-effect transistor (pFET) core region, the first gate stack including an interfacial layer, a dielectric layer of a first dielectric material on the interfacial layer, and a capping layer of a first material on the dielectric layer of the first dielectric material;
forming a second gate stack on the substrate over an input/output pFET (pFET IO) region, the second gate stack including a dielectric layer of a second dielectric material disposed directly on the substrate, an interfacial layer directly on the dielectric layer of the second dielectric material, a dielectric layer of the first dielectric material on the interfacial layer, and a capping layer of the first material on the dielectric layer of the first dielectric material;
forming a third gate stack on the substrate over an n-type field-effect transistor (nFET) core region, the third gate stack including an interfacial layer, a dielectric layer of the first dielectric material on the interfacial layer, and a capping layer of a second material on the dielectric layer of the first dielectric material;
forming a fourth gate stack on the substrate over an input/output nFET (nFET IO) region, the fourth gate stack including a dielectric layer of the second dielectric material, an interfacial layer on the dielectric layer of the second dielectric material, a dielectric layer of the first dielectric material on the interfacial layer, and a capping layer of the second material on the dielectric layer of the first dielectric material; and
forming a fifth gate stack on the substrate over a high-resistor region, the fifth gate stack including an interfacial layer, a dielectric layer of the first dielectric material on the interfacial layer, and a capping layer of the second material on the dielectric layer of the first dielectric material.

9. The method of claim 8, wherein the first and second gate stacks further comprise a capping layer of the second material above the capping layer of the first material.

10. The method of claim 9, wherein the dielectric layer of the first dielectric material of the first and second stacks is below the capping layer of the first material.

11. The method of claim 8, wherein the first material comprises a p-type work function metal or metal oxide, and the second material comprises an n-type work function metal or metal oxide.

12. The method of claim 11, wherein the p-type metal oxide comprises $Al_2O_3$, MgO, CaO, or mixtures thereof, and the n-type metal oxide comprises $La_2O_3$, $Sc_2O_3$, $Y_2O_3$, SrO, BaO, $Ta_2O_5$, $TiO_2$, $LaAlO_3$, $ZrO_2$, $Gd_2O_3$, or mixtures thereof.

13. The method of claim 8, wherein a thickness of the capping layer of the first material and the second material is less than 50 angstroms.

14. A method for fabricating a semiconductor device, the method comprising:
providing a semiconductor substrate having isolation features to separate different regions on the semiconductor substrate;
forming a first gate stack on the substrate over a p-type field-effect transistor (pFET) core region, the first gate stack including an interfacial layer, a dielectric layer of a first dielectric material on the interfacial layer, and a capping layer of a first material on the dielectric layer of the first dielectric material;
forming a second gate stack on the substrate over an input/output pFET (pFET IO) region, the second gate stack including a dielectric layer of a second dielectric material, an interfacial layer in direct contact with the dielectric layer of the second dielectric material, a dielectric layer of the first dielectric material on the interfacial layer, and a capping layer of the first material on the dielectric layer of the first dielectric material;
forming a third gate stack on the substrate over an n-type field-effect transistor (nFET) core region, the third gate stack including an interfacial layer, a dielectric layer of the first dielectric material on the interfacial layer, and a capping layer of a second material on the dielectric layer of the first dielectric material;
forming a fourth gate stack on the substrate over an input/output nFET (nFET IO) region, the fourth gate stack including a dielectric layer of the second dielectric material, an interfacial layer in direct contact with the dielectric layer of the second dielectric material, a dielectric layer of the first dielectric material on the interfacial layer, and a capping layer of the second material on the dielectric layer of the first dielectric material; and
forming a fifth gate stack on the substrate over a high-resistor region, the fifth gate stack including an interfacial layer, a dielectric layer of the first dielectric material on the interfacial layer, and a capping layer of the second material on the dielectric layer of the first dielectric material.

15. The method of claim 14, wherein the first and second gate stacks further comprise a capping layer of the second material above the capping layer of the first material.

16. The method of claim 15, wherein the dielectric layer of the first dielectric material of the first and second gate stacks is below the capping layer of the first material.

17. The method of claim 14, wherein the first material comprises a p-type work function metal or metal oxide, and the second material comprises an n-type work function metal or metal oxide.

18. The method of claim 17, wherein the p-type metal oxide comprises Al2O3, MgO, CaO, or mixtures thereof, and the n-type metal oxide comprises La2O3, Sc2O3, Y2O3, SrO, BaO, Ta2O5, TiO2, LaAlO3, ZrO2, Gd2O3, or mixtures thereof.

19. The method of claim 14, wherein a thickness of the capping layer of the first material and the second material is less than 50 angstroms.

* * * * *